US006515851B1

(12) United States Patent
Ootori et al.

(10) Patent No.: US 6,515,851 B1
(45) Date of Patent: Feb. 4, 2003

(54) SWITCH INLET UNIT AND ENTERTAINMENT SYSTEM

(75) Inventors: Yasuhiro Ootori, Tokyo (JP); Osamu Murasawa, Tokyo (JP)

(73) Assignee: Sony Computer Entertainment Inc., Tokyo (JP)

( * ) Notice: Subject to any disclaimer, the term of this patent is extended or adjusted under 35 U.S.C. 154(b) by 32 days.

(21) Appl. No.: 09/655,212

(22) Filed: Sep. 5, 2000

(30) Foreign Application Priority Data

Sep. 6, 1999 (JP) ........................................ 11-252265

(51) Int. Cl.[7] ........................................ H05K 7/00
(52) U.S. Cl. ..................... 361/679; 361/627; 439/535; 200/51 R
(58) Field of Search ................................ 361/679, 627, 361/628, 631, 636, 641, 643, 118; 439/76.1, 638, 740, 949, 209, 211, 535; 200/51 R, 51.05, 51.09

(56) References Cited

U.S. PATENT DOCUMENTS 4,266,266 A * 5/1981 Sanner ...................... 361/643
4,482,789 A * 11/1984 McVey .................... 200/43.02
4,488,201 A 12/1984 Webb et al.
5,434,740 A 7/1995 Chan
5,444,601 A * 8/1995 Honda et al. ............... 361/683
5,595,494 A * 1/1997 Wiebe ........................ 439/211
5,604,661 A * 2/1997 Nagao ........................ 361/643
5,819,912 A * 10/1998 Hou ........................ 200/51.02
5,949,640 A * 9/1999 Cameron et al. ........... 361/600
6,201,197 B1 * 3/2001 Mori et al. ............... 200/51 R
6,313,420 B1 * 11/2001 Ohashi .................... 200/302.1
6,344,619 B1 * 2/2002 Yamasaki et al. ........... 200/6 A

FOREIGN PATENT DOCUMENTS

| | | |
|---|---|---|
| CN | 347926 | 12/1998 |
| DE | 33 02 192 | 7/1984 |
| DE | 44 37 288 | 9/1995 |
| EP | 0684057 A1 | 11/1995 |
| JP | 4-8278 | 1/1992 |
| JP | 4-85347 | 7/1992 |
| JP | 11-54226 | 2/1999 |

* cited by examiner

*Primary Examiner*—Gerald Tolin
(74) *Attorney, Agent, or Firm*—Katten Muchin Zavis Rosenman

(57) ABSTRACT

A switch inlet unit comprising a power switch and an inlet accommodated in a case is provided.

The switch and the inlet are provided on the front surface of the case body, the terminals of the switch and the inlet are connected with respect to each other, and the joint is held in the case body.

6 Claims, 9 Drawing Sheets

SWITCH INLET UNIT AND ENTERTAINMENT SYSTEM

This application claims a priority based on Japanese Patent Application No. 11-252265 filed on Sep. 6, 1999, the entire contents of which are incorporated herein by reference for all purposes.

BACKGROUND OF THE INVENTION

The present invention relates to a switch inlet unit comprising a power switch and an inlet accommodated in a case.

In an entertainment system 900 that is operated by a supply of AC power source, when the power cable for receiving the power supply from outside is constructed to be detachable, an inlet 902 of AC power supply is provided on the main body of the entertainment system 900. In contrast to it, when the entertainment system 900 is provided with a power switch 901, it is normally provided independently of the AC inlet 902. The appearance of such a state is shown in FIG. 11.

SUMMARY OF THE INVENTION

Therefore, when assembling the conventional entertainment system 900, the switch 901 and inlet 902 are mounted separately, and thus wiring has to be carried out separately as well. As a consequent, it requires much time and effort in assembling.

In order to restrain undesirable radiation from the power wiring, the wiring in the entertainment system should be provided with an undesirable radiation restraining element such as a ferrite core. However, in the conventional system, the undesirable radiation restraining element has to be mounted on the wiring in the entertainment system after the switch is mounted and when the power wiring is carried out. Therefore, there is a case where the mounted undesirable radiation restraining element obstructs the assembly operation. In addition, since a space corresponding to the size of the undesirable radiation restraining element is required, the flexibility in arrangement of components within the enclosure is decreased.

Accordingly, the first object of the present invention is to provide a switch inlet unit comprising a switch and an inlet that can be easily mounted to the entertainment system.

The second object of the present invention is to provide the switch inlet unit of a structure that can be easily assembled.

The third object of the present invention is to provide a switch inlet unit that eliminates the need for providing an undesirable radiation restraining element at some midpoint of wiring.

The switch inlet unit for achieving the first object of the invention is a switch inlet unit to be mounted on electronic equipment comprising a power switch, an inlet, and a case for receiving the power switch and the inlet, wherein a terminal of the power switch and a terminal of the inlet are electrically connected in the case, and a switching lever of the power switch and an inserting hole of the inlet are aligned on the same surface of the case.

The switch inlet unit for achieving the second object of the invention is a switch inlet unit according to the switch inlet unit, wherein the case comprises a case body and a cover that is detachable to the case body, and the power switch and the inlet are held within the case body.

The switch inlet unit for achieving the third object of the invention is a switch inlet unit according to the switch inlet unit, wherein the cover has a through hole for passing a power distribution cable through, the power distribution cable passes through the through hole, the cover is provided with a projection for mounting an undesirable radiation restraining element, and the projection is passed through the through hole.

DESCRIPTION OF THE PREFERRED EMBODIMENTS

Figure 1:
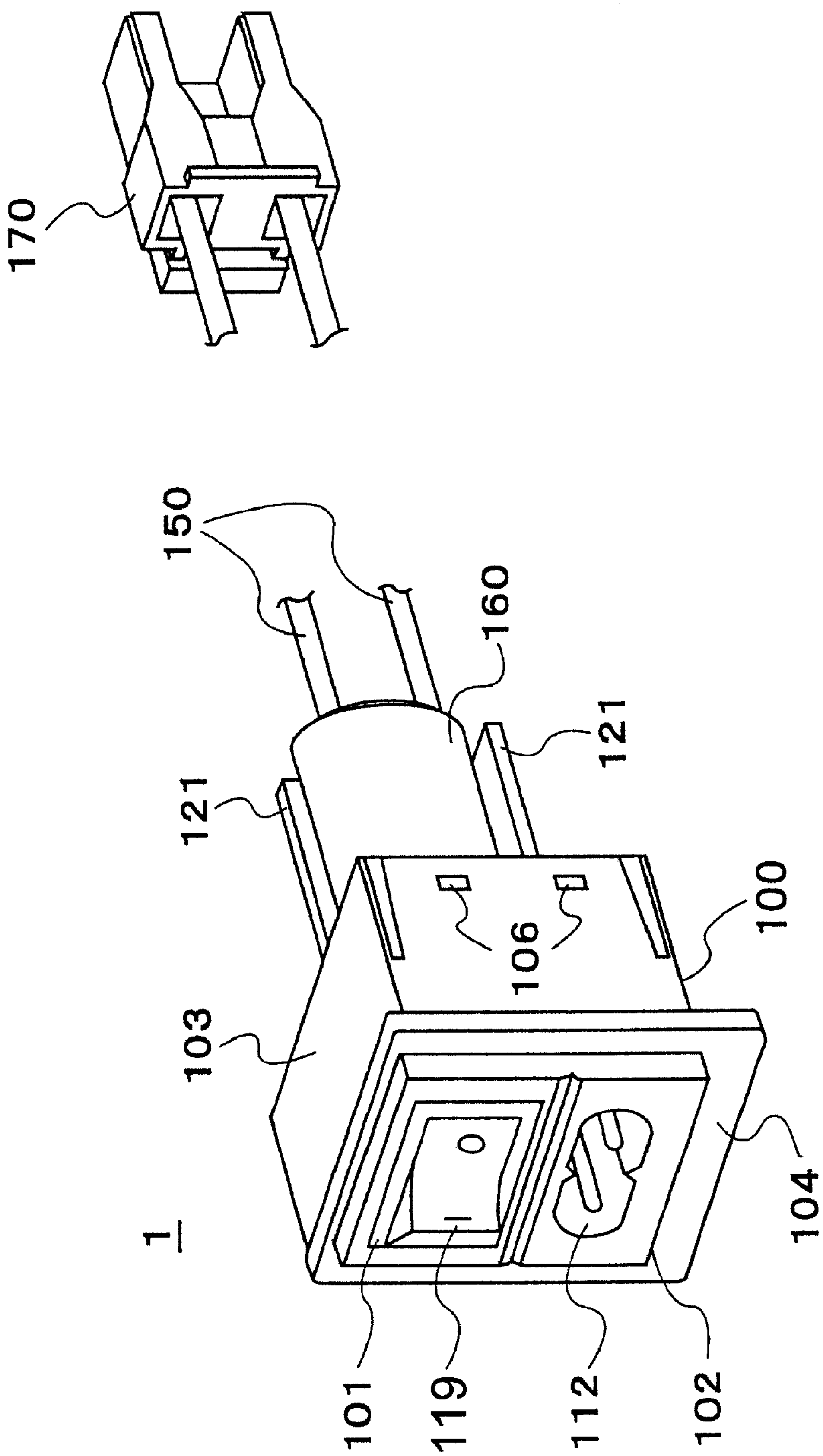
FIG. 1 is a front perspective view of the switch inlet unit according to the present invention.

Referring to the drawings, an embodiment of the switch inlet unit according to the present invention will now be described.

Figure 2:
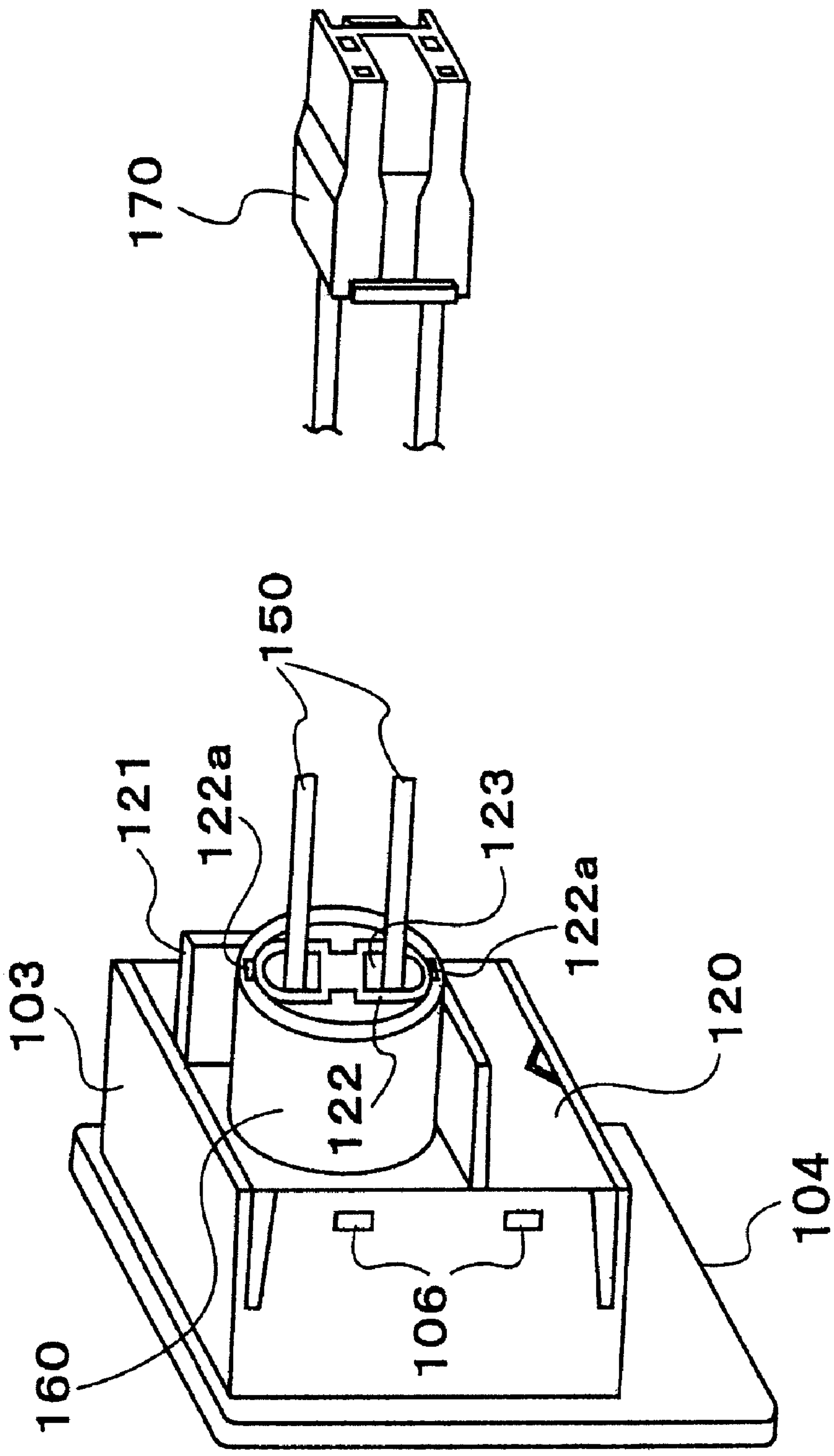
FIG. 2 is a back perspective view of the switch inlet unit according to the present invention.

FIG. 1 is a front perspective view of the switch inlet unit 1 (hereinafter referred to simply as "unit"). FIG. 2 is a back perspective view of the case. As shown in FIG. 1 and FIG. 2, the unit 1 comprises a case 100 formed of an insulating material, a power switch 101 (hereinafter referred to simply as "switch"), and an inlet 102. It is also possible to provide a switch inlet unit 1 by connecting extension cables 150 to the unit 1 in advance.

The case 100 comprises a case body 103 and a cover 120 for being detachably mounted on the backside of the case body 103. The switch 101 and the inlet 102 are received within the case 100. More specifically, a switching lever 119 of the switch 101 and an inserting hole 112 of the inlet 102 are arranged on the front side of the case body 103. There is provided a fixing plate 104 around t e switching lever 119 of the switch 101 and the inserting hole 112 of the inlet 102 for mounting the unit 100 to an entertainment system. The mounting plate 104 m y be formed integrally with the case body 103. 103 when the cover 120 is removed from the case 100.

On the back surface of the switch 101, there is provided a pair of terminals 111*a* and 111*b*, each of which is to be connected with each of distribution cable 150 and a pair of terminals 112*a* and 112*b*, each of which is to be connected with the inlet 103. On the backside of the inlet 103, there is provided a pair of terminals 113*a* and 113*b*, each of which is to be connected with the each terminal 112*a* and 112*b* of the switch. The distribution cables 150 each of which connected to the each terminal 111*a* and 111*b* are led through the through hole 123 provided on the projection 122 of the cover 120 to the outside of the unit 1.

The terminals 112*a* and 112*b* of the switch and the terminals 113*a* and 113*b* of the inlet are respectively connected by metallic members 114*a* and 114*b* . The joints between the terminals 112*a* and 112*b*, 113*a* and 113*b* and the metallic members 114*a* and 114*b* are soldered.

Figure 4:
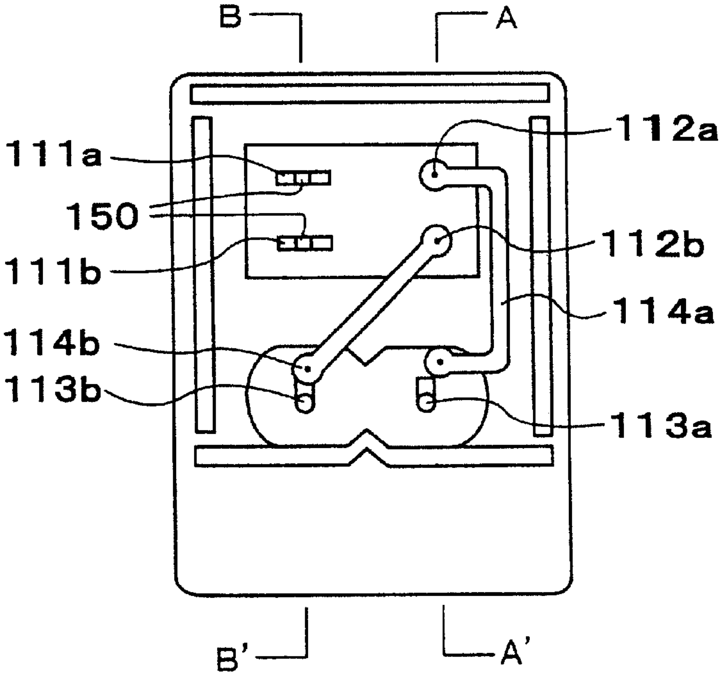
FIG. 4 is a back view showing the state within the case of the switch inlet unit according to the present invention.
Figure 5:
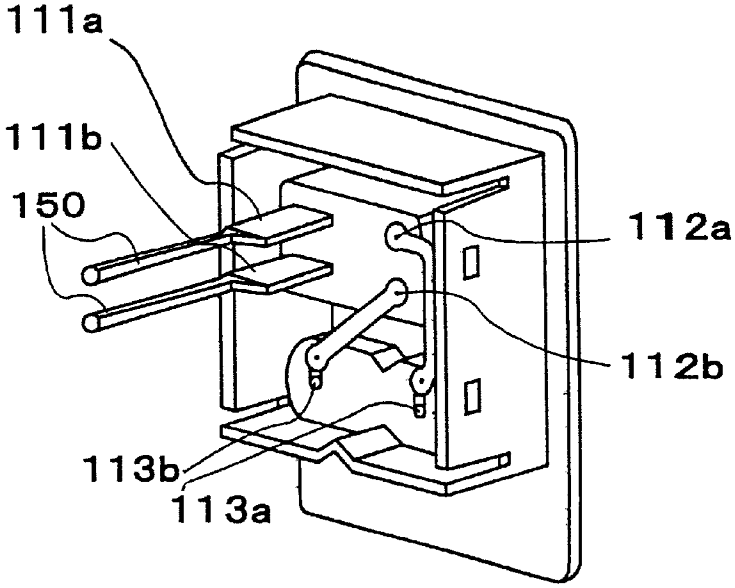
FIG. 5 is a back perspective view showing the state within the case of the switch inlet unit according to the present invention.
Figure 6:
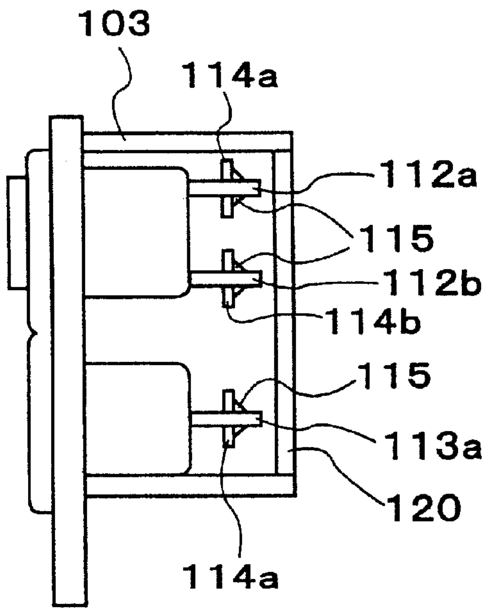
FIG. 6 is a cross section taken along the line A—A' of the switch inlet unit according to the present invention.

FIG. 6 is a cross section taken along the line A—A' of FIG. 4. The terminals 112*a* and 112*b*, 113*a* and 113*b* and the conductive members 114*a* and 114*b* are fixed by solder 115. Each of the metallic members 114*a* and 114*b* is formed in the shape of a plate.

Figure 7:
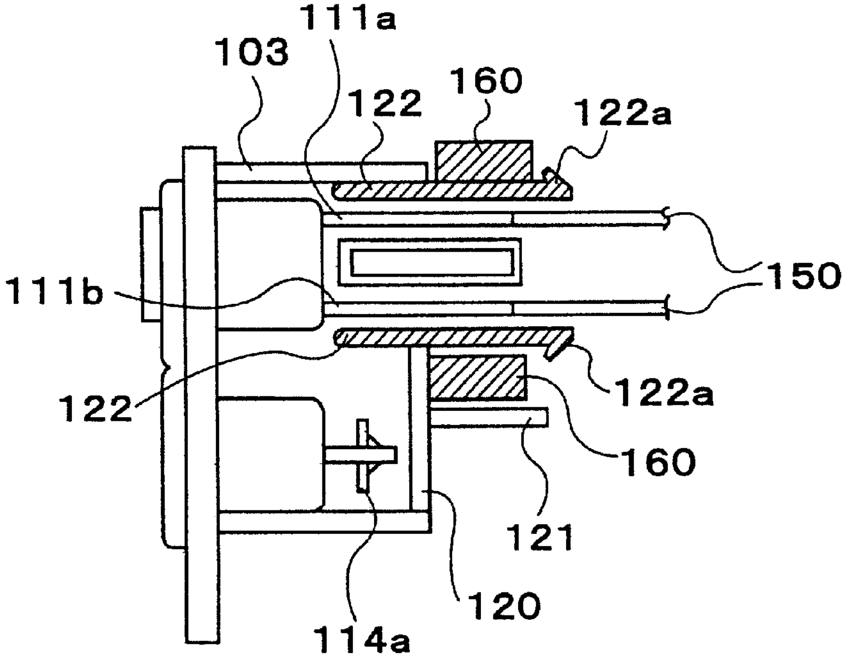
FIG. 7 is a cross section taken along the line B—B' of the switch inlet unit according to the present invention.

FIG. 7 is a cross section taken along the line B—B' of FIG. 4. The terminals 111*a* and 111*b* are held within the projection 122 and protected thereby. There is provided a locking portion 122*a* on the tip of the projection 122 so that the ferrite core 160 detachably mounted on the projection 122 cannot be detached easily.

Figure 3:
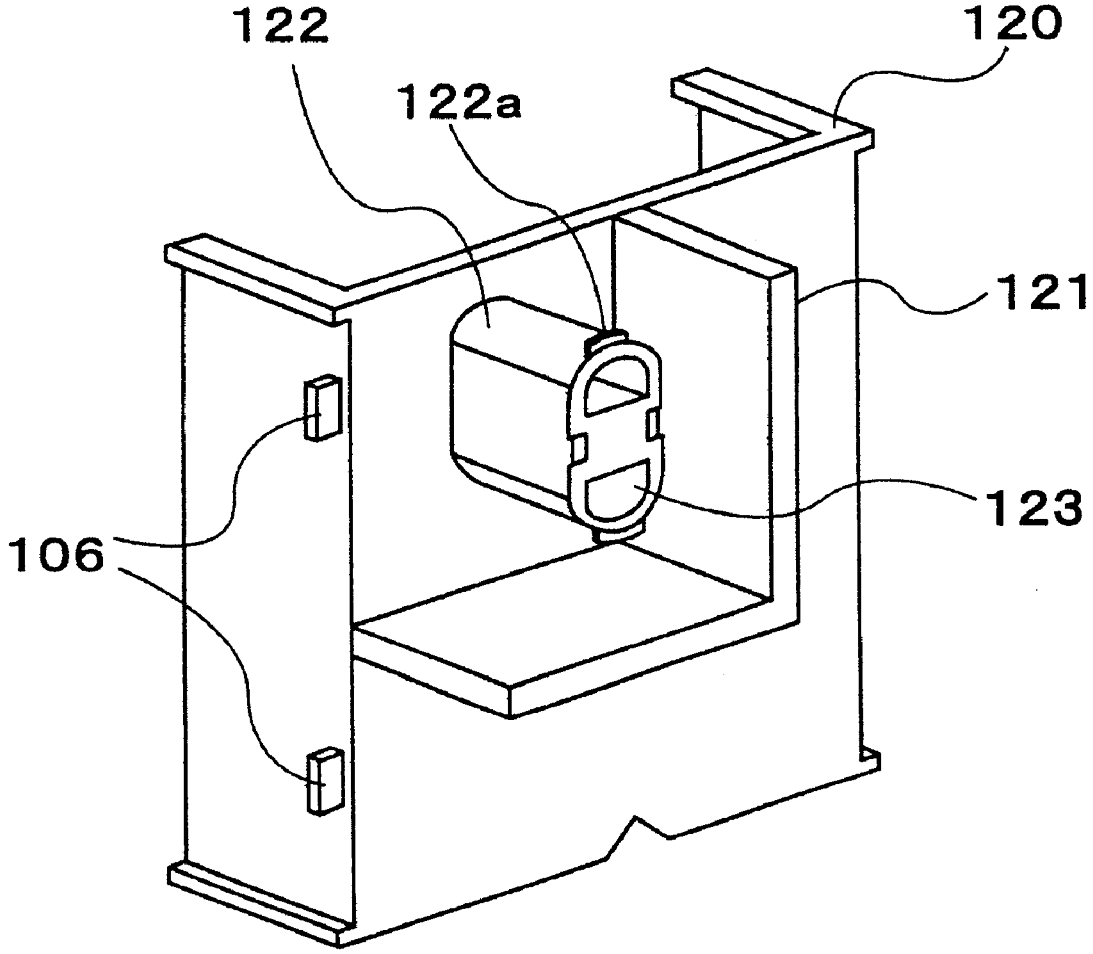
FIG. 3 is a perspective view showing a structure of the cover of the switch inlet unit according to the present invention.

FIG. 3 shows the state of the cover 120 when detached from the case body 103.

The cover 120 comprises locking portions 106 on the side surface for locking to the case body 103, a projection 122 on the backside, and a protective wall 121.

The projection 122 is provided with through holes 123 for leading the power distribution cables 150 out. The each through holes 123 is provided with a terminal 111*a* and 111*b* held therein. The cover 120 is formed of an insulating material, and the outer shape and dimension of the projection 122 are such that an undesirable radiation restraining element of a hollow cylindrical shape, for example a ferrite core 160, may be mounted thereon. The projection 122 is also provided with locking portions 122*a* for locking the ferrite core 160 on the tip thereof.

FIG. 1 and FIG. 2 show the state where the cover 120 is locked on the case body 103 by the locking portion 106. A socket 170 to be connected to other equipment is connected to the tip of the cables 150. The projection 122 is provided with the ferrite core 160 thereon. The ferrite core 160 may be attached on the projection 122 by adhesives or the like, or may be detachably locked by means of the locking portions 122*a* provided on the projection 122. The ferrite core 160 mounted on the cover 120 is protected by the protective wall 121.

Figure 8:
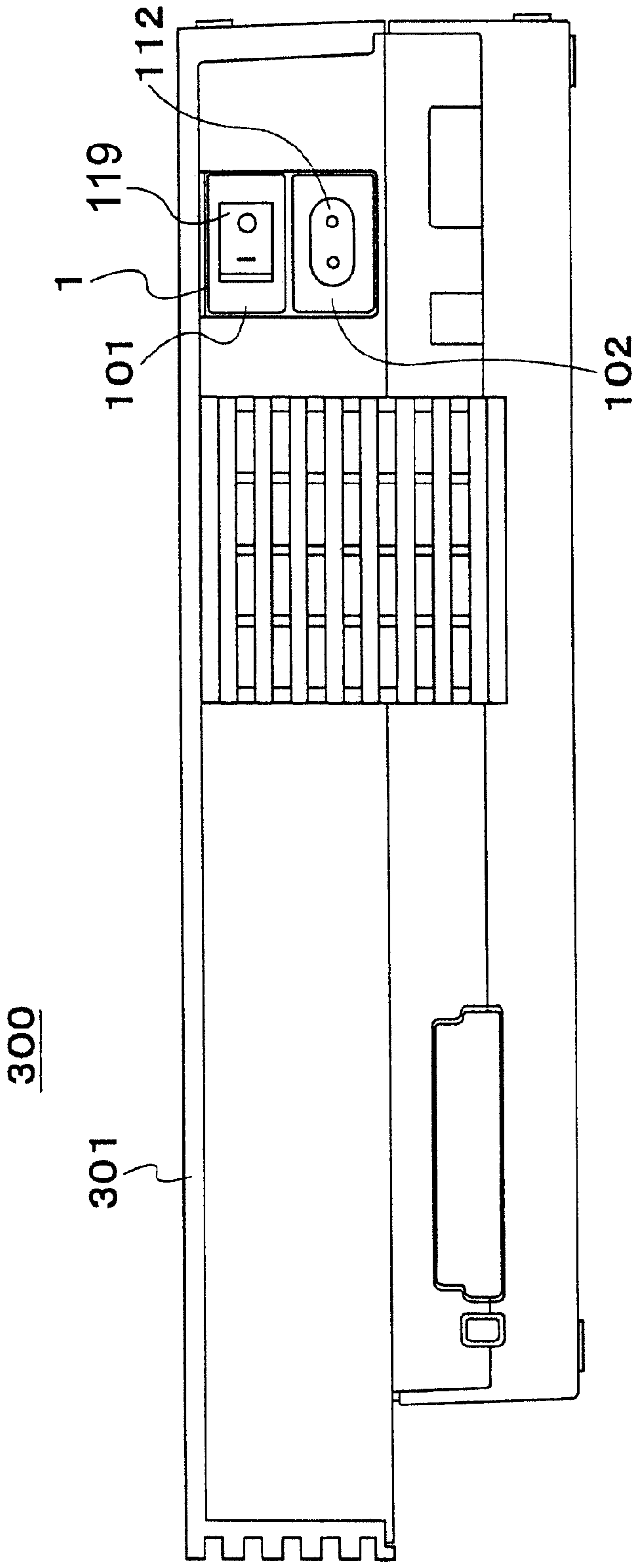
FIG. 8 is an explanatory drawing illustrating the state where the switch inlet unit according to the present invention is mounted in the entertainment system.

FIG. 8 shows the appearance an entertainment system 300 when the unit 1 is mounted thereto. The unit 1 is mounted on the enclosure 301 of the entertainment system 300 on the backside thereof so that the switching lever 119 of the switch 101 and the inserting hole 112 of the inlet 102 are exposed.

Figure 9:
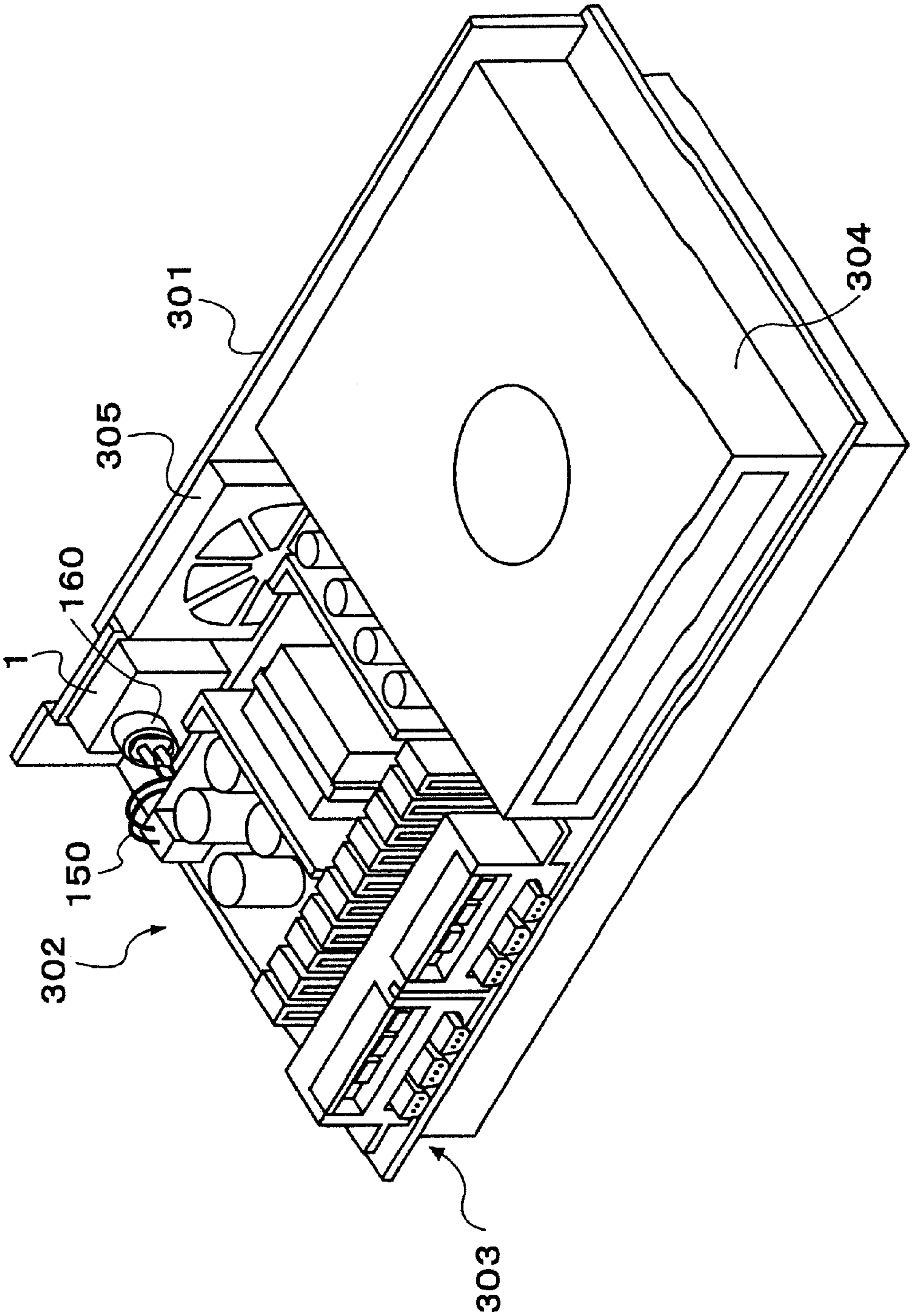
FIG. 9 is an explanatory drawing illustrating the interior structure of the entertainment system when the switch inlet unit according to the present invention is mounted.

FIG. 9 is an internal structure of the entertainment system 300 in the same state as FIG. 8. The entertainment system 300 comprises at least an enclosure 301, a unit 1 mounted on the enclosure 301, a power unit 302, a connector unit 303, a disc unit 304, and an exhaust fan 305. The unit 1 and the power unit 302 are interconnected by the cables 150.

As is described thus far, the switch inlet unit 1 of the present invention comprises the switch 101, the inlet 102 received in the case 100, and the wiring already carried out in advance. Therefore, it is not necessary to mount the switch and the inlet independently to the entertainment system and carry out wiring after that. Therefore, the mounting operation can be easily done. In addition, the switching lever of the switch and the inserting hole of the inlet are arranged on the same surface of the case, so that the user of the entertainment system 300 can operate it easily when the unit 1 is mounted onto the entertainment system.

The case 100 of the unit 1 comprises two parts, that is, a case body 103 and a cover 120. Therefore, since the number of the components that constitute the unit 1 is small, it is easy to assemble.

Since the terminals of the switch 101 and the inlet 102 are aligned within the case body 103, it is easy to carry out wiring within the case body 103.

The terminals of the switch 111 are standing substantially perpendicular to the back surface of the case and received within the projection 122 of the cover 120. To the terminals 111, the distribution cables 150 are connected and led through the through holes 123 of the projection 122 to the outside. By mounting a ferrite core 160 onto the projection 122, the same effect as in the conventional system in which the ferrite core 160 is directly mounted on a cable can be obtained.

Figure 10:
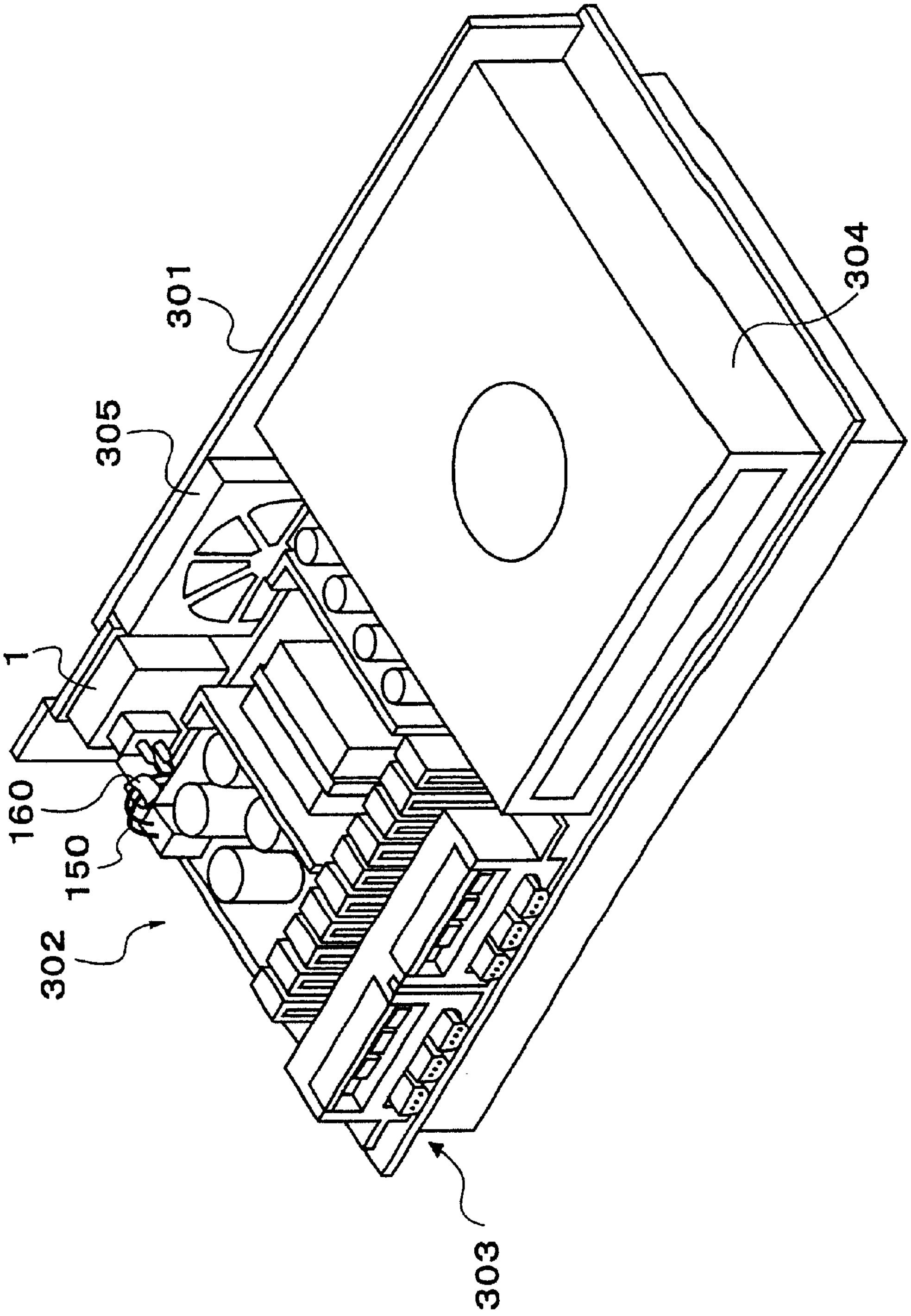
FIG. 10 is an explanatory drawing illustrating the interior structure of the entertainment system when the ferrite core is mounted on the wiring.
Figure 11:
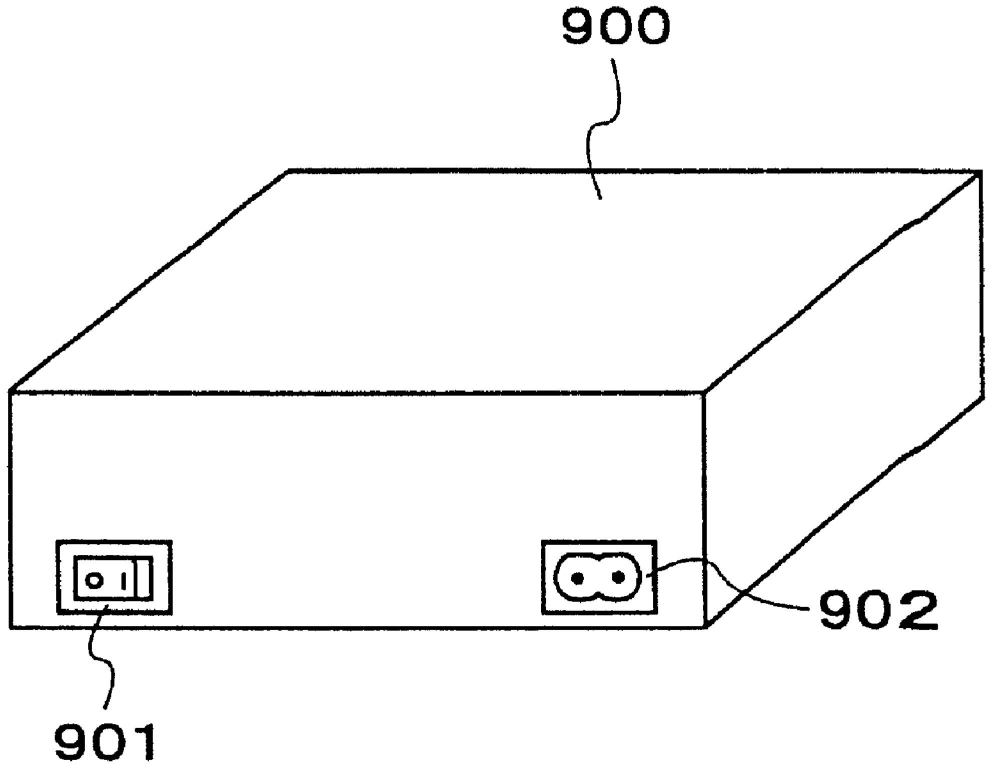
FIG. 11 (PRIOR ART)
FIG. 11 is a drawing showing the arrangement of the power switch and AC inlet according to the conventional art.

For example, FIG. 10 shows the unit 1 according to the present embodiment illustrating the case where the ferrite core 160 is mounted on the distribution cable 150. As shown in this figure, since the ferrite core 160 is not fixed to the cover 120, the ferrite core 160 exists somewhere on the cable 150. Therefore, assembly operation of the entertainment system 300 requires time and effort. In contrast to it, when the ferrite core 160 is fixed to the cover 120 as shown in FIG. 9, assembly operation of the entertainment system 300 can be performed easily. In addition, when designing the layout of the components within the entertainment system 300, what is to be considered is only the arrangement of the unit 1, whereby flexibility of the design increases.

According to the present invention, a switch inlet unit comprising a switch and an inlet for facilitating assembly operation of the entertainment system is provided.

According to the present invention, a switch inlet unit having a structure in which the assembly can be carried out easily is provided.

In addition, in order to simplify the internal structure of the entertainment system, a switch inlet unit having a detachable undesirable radiation retaining element is provided.

What is claimed is:

1. An entertainment system comprising:

a system enclosure containing a switch device, a power unit, a connector unit, and a disc unit;

wherein said switch device further comprises a power switch having a switch lever and a power switch terminal, a power inlet having a power inlet opening and a power inlet terminal, and a case for receiving said power switch and said power inlet;

wherein said power switch terminal and said power inlet terminal are electrically connected within said case;

wherein said switch lever and said power inlet opening are aligned on a surface of said case;

wherein said case surface is mounted to said system enclosure in such a manner that said case surface is exposed from said entertainment system; and wherein said power unit receives a power supply from outside the entertainment system through said switch device.

2. A switch device to be mounted on electronic equipment comprising:

a power switch having a switch lever and a power switch terminal;

a power inlet having a power inlet opening and a power inlet terminal; and a case for receiving said power switch and said power inlet;

wherein said power switch terminal and said power inlet terminal are electrically connected in said case;

wherein said power inlet opening and said switch lever are aligned on the same surface of said case;

wherein said case comprises a case body and a cover that is detachable from said case body, and wherein said power switch and said power inlet are held within said case body;

wherein said cover has a through hole for passing a power distribution cable therethrough; and wherein said cover further comprises a projection extending through said through hole for mounting a radiation restraining element thereon.

3. A switch device according to claim 2, wherein said projection further comprises a radiation restraining element mounted thereon.

4. A switch device according to claim 2, wherein said radiation restraining element is a ferrite core.

5. A switch device according to claim 3, wherein said radiation restraining element is a ferrite core.

6. An entertainment system comprising:

a system enclosure containing a switch device, a power unit, a connector unit, and a disc unit;

wherein said switch device further comprises a power switch having a switch lever and a power switch terminal, a power inlet having a power inlet opening and a power inlet terminal, and a case for receiving said power switch and said power inlet;

wherein said case comprises a case body and a cover that is detachable from said case body, and wherein said power switch and said power inlet are held within said case body;

wherein said power switch terminal and said power inlet terminal are electrically connected within said case;

wherein said switch lever and said power inlet opening are aligned on a surface of said case;

wherein said case surface is mounted to said system enclosure in such a manner that said case surface is exposed from said entertainment system;

wherein said power unit receives a power supply from outside the entertainment system through said switch device;

wherein said cover has a through hole for passing a power distribution cable therethrough; and wherein said cover further comprises a projection extending through said through hole for mounting a radiation restraining element thereon.

* * * * *